(12) United States Patent
Endou et al.

(10) Patent No.: US 6,259,274 B1
(45) Date of Patent: Jul. 10, 2001

(54) CLOCK SIGNAL GENERATOR

(75) Inventors: Yoshimasa Endou, Miyagi; Katuhiko Kurosawa, Tokyo, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/412,564

(22) Filed: Oct. 5, 1999

(30) Foreign Application Priority Data

Oct. 5, 1998 (JP) ................................................. 10-282153

(51) Int. Cl.$^7$ ................................................. H03K 19/096
(52) U.S. Cl. ................................................. 326/93; 326/52
(58) Field of Search ............................... 326/46, 93, 52, 326/95, 98; 340/825.14; 371/22.36, 27, 7; 327/3, 7, 12

(56) References Cited

U.S. PATENT DOCUMENTS

| | | | | |
|---|---|---|---|---|
| 5,111,455 | * | 5/1992 | Negus | 370/112 |
| 5,235,292 | * | 8/1993 | Endo et al. | 331/49 |
| 5,440,251 | * | 8/1995 | Knight et al. | 327/3 |

FOREIGN PATENT DOCUMENTS

| | | |
|---|---|---|
| 1248825 | 10/1989 | (JP) . |
| 2203615 | 8/1990 | (JP) . |
| 4-240915 | 8/1992 | (JP) . |
| 5335907 | 12/1993 | (JP) . |
| 697789 | 4/1994 | (JP) . |
| 743397 | 2/1995 | (JP) . |
| 7264020 | 10/1995 | (JP) . |

* cited by examiner

Primary Examiner—Michael Tokar
Assistant Examiner—Don Phu Le
(74) Attorney, Agent, or Firm—Young & Thompson

(57) ABSTRACT

A clock signal generator enables a clock signal having the same duty ratio as unchanged original duty ratio of original signal whose edge already had become dull to be generated in spite of simple constitution. A first and a second clock signals are outputted through open collector corresponding to respective "H" level and "L" level of an original clock signal. Only a trailing edge together with sharp change of speed of the clock signal is used. An output clock signal whose duty ratio is the same as that of the original clock signal is generated by obtaining exclusive OR of both of these clock signals, while implementing ½-times frequency division to the first and the second clock signals. Further, when phase of output signal of EXOR circuit disagrees with phase of signal which is in-phase to the original clock signal inputted from input terminal, "L" level is established forcibly to a D terminal of a second D-FF, thus causing phase of the clock signals to agree with each other.

16 Claims, 3 Drawing Sheets

CLOCK SIGNAL GENERATOR

BACKGROUND OF THE INVENTION

The present invention relates to a clock signal generator for generating a clock signal used for digital information equipment and so forth. More to particularly this invention relates to a clock signal generator which enables change of duty ratio of the clock signal to be inhibited.

DESCRIPTION OF THE PRIOR ART

A clock signal with fixed cycle often operates as a basis of various kinds of internal timing in internal circuits of the conventional digital information equipment. Such the clock signal possesses a duty ratio of approximately degree of 50% immediately after generation. Change of the duty ratio from value of degree of 50% occurs according to various kinds of causes. Such the causes are various kinds of capacitance added by delay on transmission line of substrate wiring of the device or connection of various kinds of gate circuit and/or change of power source voltage level. Under the situation, there are proposed some clock signal generators for inhibiting change of duty ratio caused by various kinds of causes of such the clock signals.

Figure 1:
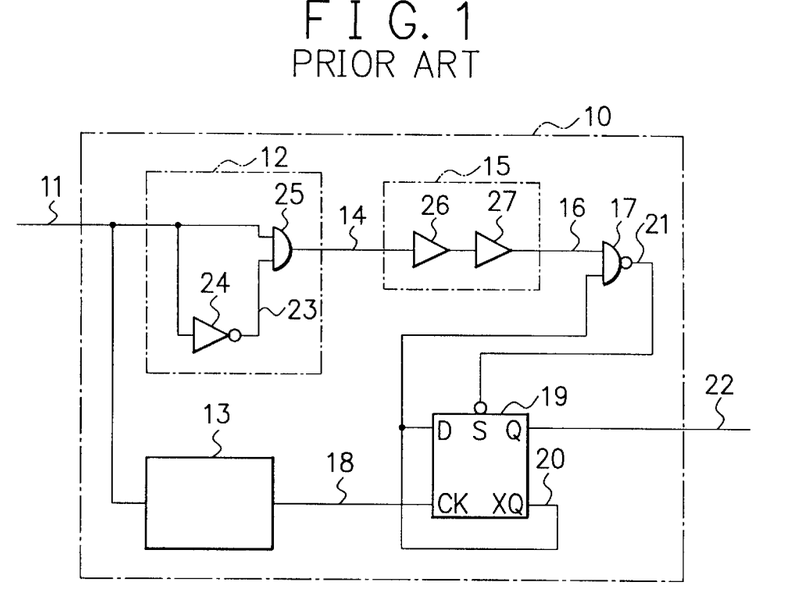
FIG. 1 is a constitution view showing outline of constitution of conventional clock signal generator.

FIG. 1 shows an outline of configuration of a clock signal generator proposed conventionally. In the clock signal generator 10, an input clock signal 11 is inputted both to a leading detector 12, and a frequency multiplier 13. When a leading of the input clock signal 11 is detected by the leading detector 12, a leading detection signal 14 of pulse shaped waveform is outputted therefrom. This pulse shaped waveform of the leading detection signal 14 is inputted to a delay circuit 15. A delayed signal 16 is delayed by the delay circuit 15 only fixed time. The delayed signal 16 delayed by the delay circuit 15 only fixed time is inputted to one side of input terminal of 2-input NAND circuit 17. Further, the input clock signal is multiplied by a frequency multiplier 13 in order to generate a multiplied signal 18. The multiplied signal 18 is inputted to a clock input terminal (CK) of a Delayed Flip-Flop 19 (herein after referring to D-FF) with a set terminal. An inversion output signal 20 outputted from an inversion output terminal (Q(−)) of the D-FF 19 is inputted to the data input terminal (D) and the another input terminal different from a terminal to which the delayed signal 16 is inputted in the 2-input NAND circuit 17. An output signal 21 of the 2-input NAND circuit 17 is inputted to the set input terminal (S). An output clock signal 22 is outputted from an output terminal (Q) of the D-FF 19. In the D-FF 19, when the output signal of "L" level from the 2-input NAND circuit 17 is inputted to the set input terminal (S), the output clock signal 22 outputted from the output terminal (Q) is set to "H" level, and the inversion output signal 20 outputted from the inversion output terminal (Q(−)) is set to "L" level.

Figures 2A, 2B, 2C, 2D:
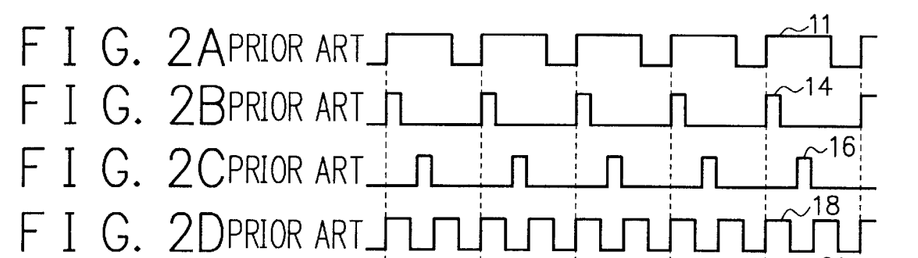
FIG. 2A is a signal waveform view showing signal waveform of a clock input signal 11.
FIG. 2B is a signal waveform view showing signal waveform of a leading detection signal 14.
FIG. 2C is a signal waveform view showing signal waveform of a delay signal 16.
FIG. 2D is a signal waveform view showing a signal waveform of a frequency multiplied signal 18.
Figures 2E, 2F, 2G:
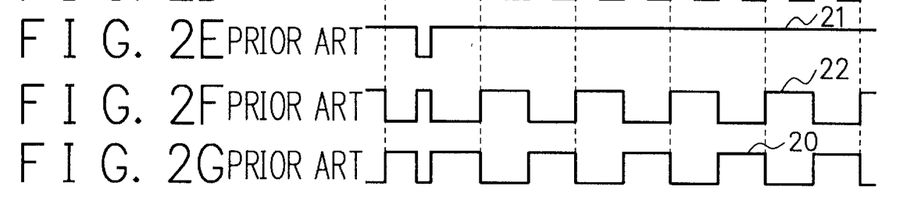
FIG. 2E is a signal waveform view showing a signal waveform of an output signal 21.
FIG. 2F is a signal waveform view showing a signal waveform of an output clock signal 22.
FIG. 2G is a signal waveform view showing a signal waveform of an inversion output signal 20.

The leading detection circuit 12 is provided with an inverter 24 (hereinafter referring to INV 24) which outputs the inversion clock signal 23 that logic of the input clock signal 11 is inverted, and an AND circuit 25 in which the input clock signal is inputted to one side of input terminal thereof and the inversion clock signal 23 is inputted to the another side of input terminal thereof. The leading detection signal 14 is outputted as a pulse signal having width corresponding to only delay time of the INV circuit 24, while being synchronized with leading of the input clock signal according to such constitution of the leading detection circuit 12. The delay circuit 15 is provided with delay cells 26, and 27 for delaying inputted signal with every fixed time. The delayed signal 16 is obtained in such a way that the delay cells 26, and 27 cause the leading detection signal 14 to be delayed corresponding to only prescribed time. The frequency multiplier 13 is capable of frequency multiplying the input clock signal by two times. FIGS. 2A to 2G indicate appearance of change of the signal in respective sections of this device. FIG. 2A indicates signal waveform of the clock input signal 11. FIG. 2B indicates signal waveform of the leading detection signal 14. FIG. 2C indicates signal waveform of the delayed signal 16. FIG. 2D indicates signal waveform of the frequency multiplied signal 18. FIG. 2E indicates signal waveform of the output signal 21. FIG. 2F indicates signal waveform of the output clock signal 22. FIG. 2G indicates signal waveform of the inversion output signal 20. Here, the input clock signal 11 whose duty ratio is not held 50% is inputted under the condition of prescribed cycle as shown in FIG. 2A. The leading detection circuit 12 detects a leading of the input clock signal 12 inputted in such the way, thus outputting the leading detection signal 14 with pulse shaped waveform having width corresponding to delay time of the above-described INV circuit 24 as shown in FIG. 2B. The leading detection signal 14 is delayed only prescribed time by the delay circuit 15 as shown in FIG. 2C. On the other hand, the frequency multiplier 13 frequency multiplies the input clock signal 11 by two times of original frequency in order to output frequency multiplied signal 18 whose frequency is two times of the original frequency as shown in FIG. 2D.

The D-FF 19 functions as a Toggle Flip-Flop (hereinafter referring to T-FF) synchronized with the frequency multiplied signal 18 because the inversion output signal 20 is inputted to the data input terminal (D). According to this operation, the D-FF 19 inverts an output logic in every input of the frequency multiplied signal 18, thus the D-FF 19 functions as a frequency dividing circuit for the frequency multiplied signal 18. On the other hand, the D-FF 19 which frequency divides the frequency multiplied signal 18 outputs the output clock signal 22. When a phase of the leading of this output clock signal 22 of the D-FF 19 is different from a phase of the leading of the input clock signal 11 by 180 degrees, the output signal 21 as shown in FIG. 2E is outputted as a negative pulse from the 2-input NAND circuit 17. The output clock signal from the D-FF 19 is fixed to "H" level in spite of the frequency multiplied signal 18 in order to harmonize both phases with each other. Subsequently, the D-FF 19 generates the output clock signal 22 (FIG. 2F) whose output is inverted in every input of the frequency multiplied signal 18 and the inversion output signal 20 (FIG. 2G). Thus it is capable of being generated the clock signal with duty ratio 50 %, whose phase is harmonized with that of the input clock signal.

Technology with regard to such the clock signal generator is disclosed in, for instance, the Japanese Patent Application Laid-Open No. HEI 4-240915 "Clock Signal Phase Establishment Circuit".

However, in such the conventional clock signal generator, there is the problem that it is incapable of being harmonized the input phases with each other when the input clock signal whose leading becomes dull is inputted. Namely, when the leading of the input clock signal 19 becomes dull, it is incapable of being generated set signal for the sake of phase harmonization to be inputted to the D-FF 19 with prescribed timing. Thus, in recent year, when a clock signal is transferred to another device through one device, leading edge or trailing edge of a clock signal becomes dull. For that reason, in some cases, another device to which the output clock signal is inputted does not operate accurately. Further, in design of the above described frequency multiplier or delay circuit, man-hour of design and manufacturing increase because manufacturing condition and so forth should be considered.

In particular, with high speed tendency of the clock signal of late years, in case where the clock signal is inputted through level comparator with high speed operation from external section, change in edge of the clock signal of an open collector output or open drain output becomes dull. Because, the clock signal is outputted gradually since transistor constituting level comparator becomes OFF state. Consequently, when such signal is inputted to another device of a CMOS (Complementary Metal Oxide Semiconductor) device and so forth, such the signal causes the duty ratio of the signal to be changed. Further, when such the leading edge or the trailing edge becomes dull, change of the input signal becomes slow in the neighborhood of the threshold value of the level comparator, so that the conventional clock signal generator is easy to be influenced by change of power source voltage of the device or manufacturing dispersion of the device, furthermore, there is the problem that the duty ratio changes.

SUMMARY OF THE INVENTION

In view of the foregoing, it is an object of the present invention, in order to overcome the above-mentioned problem, to provide a clock signal generator with the simple constitution, which generator generates a clock signal having the same duty ratio as the original duty ratio of the signal whose shape of leading edge or trailing edge had become dull.

According to a first aspect of the present invention, in order to achieve the above mentioned object, there is provided a clock signal generator which comprises a first frequency dividing means for implementing ½-times frequency division to a first pulse signal which changes corresponding to high level period of a clock signal having prescribed duty ratio while being synchronized with a trailing edge of the first pulse signal, a second frequency dividing means for implementing ½-times frequency division to a second pulse signal which changes corresponding to low level period of the clock signal while being synchronized with a trailing edge of the second pulse signal, and an exclusive OR circuit for supplying a first frequency division signal generated by the first frequency dividing means to one side of an input terminal and for supplying a second frequency division signal generated by the second frequency dividing means to an another side of an input terminal, thus outputting an output clock signal from an output terminal thereof.

Namely, in the first aspect of the present invention, based on a first pulse signal which changes corresponding to high level period of a clock signal having prescribed duty ratio and a second pulse signal which changes corresponding to low level period of the clock signal, such the first pulse signal and the second pulse signal undergo ½-times frequency division while being synchronized with respective trailing edges in order to obtain exclusive OR of the first and the second pulse signals. According to this operation, even though the leading edges of the first and the second pulse signals obtained from the clock signal had become dull, it is capable of being generated an output clock signal which has the unchanged original duty ratio of the clock signal and whose both edges are sharp.

According to a second aspect of the present invention, there is provided a clock signal generator which comprises a pulse signal generating means for generating a first pulse signal which is in-phase to high level period of a clock signal having prescribed duty ratio and a second pulse signal which is in-phase to low level period of the clock signal, a first frequency dividing means for implementing ½-times frequency division to a first pulse signal generated by the pulse signal generating means while being synchronized with a trailing edge of the first pulse signal, a second frequency dividing means for implementing ½-times frequency division to a second pulse signal generated by the pulse signal generating means while being synchronized with a trailing edge of the second pulse signal, and an exclusive OR circuit for supplying a first frequency division signal generated by the first frequency dividing means to one side of input terminal thereof and for supplying a second frequency division signal generated by the second frequency dividing means to another side of input terminal thereof, and for outputting an outputting clock signal from an output terminal of the exclusive OR circuit.

Namely, in the second aspect of the present invention, there is generated a first pulse signal from a clock signal having prescribed duty ratio which first pulse signal changes corresponding to high level period f the clock signal, and a second pulse signal from the clock signal which second pulse signal changes corresponding to low level period of the clock signal. The first pulse signal and the second pulse signal undergo ½-times frequency division while being synchronized with respective trailing edges in order to obtain exclusive OR of both pulse signals. According to this operation, even though the leading edge of the clock signal itself had become dull, it is capable of being generated an output clock signal which has the unchanged original duty ratio of the clock signal and whose both edges are sharp, because only trailing edge of the first and the second pulse signal obtained from the clock signal is used.

According to a third aspect of the present invention, in the first or the second aspect, there is provided a clock signal generator, wherein the first frequency dividing means implements ½-times frequency division to said first pulse signal while being synchronized with a leading edge of the first pulse signal and the second frequency dividing means implements ½-times frequency division to the second pulse signal while being synchronized with a leading edge of the second pulse signal.

Namely, in the third aspect of the present invention, there is generated a first pulse signal from a clock signal having prescribed duty ratio which first pulse signal changes corresponding to high level period of the clock signal, and a second pulse signal from the clock signal which second pulse signal changes corresponding to low level period of the clock signal. The first pulse signal and the second pulse signal undergo ½-times frequency division while being synchronized with respective leading edges in order to obtain exclusive OR of both pulse signals. According to this operation, even though trailing edges of the first and the second pulse signals obtained from the clock signal had become dull, or a trailing edge of the clock signal itself had become dull, it is capable of being generated an output clock signal which has the unchanged original duty ratio of the clock signal and whose both edges are sharp, because only leading edges of the first and the second pulse signal obtained from the clock signal is used.

According to a fourth aspect of the present invention, in any of the first to the third aspects, there is provided a clock signal generator, wherein any of either the first frequency dividing means or the second frequency dividing means changes phase of the output clock signal according both to the output clock signal, and either of the first pulse signal or the second pulse signal.

Namely, in the fourth aspect of the present invention, the phase of the output clock signal is compared with the phase of the first pulse signal or the second pulse signal by using any of either the first frequency dividing means or the second frequency dividing means, based on this comparison the phase of the output clock signal is changed. According to this operation, it is capable of being generated the output clock signal whose both edges are sharp and which has the unchanged original duty ratio of the original clock signal from the clock signal having prescribed duty ratio.

According to a fifth aspect of the present invention, in any of the first to fourth aspects, there is provided a clock signal generator, wherein the pulse signal generating means comprises a discriminating means for discriminating whether voltage level of the clock signal exceeds predetermined reference voltage, a first pulse generating means for generating the first pulse by outputting prescribed logical level when the voltage level of the clock signal exceeds the reference voltage by means of the discriminating means, and a second pulse generating means for generating the second pulse by outputting the prescribed logical level when the voltage level of the clock signal does not exceed the reference level by means of the discriminating means.

Namely, in the fifth aspect of the present invention, a discriminating means compares to be discriminated a prescribed reference voltage with voltage level of the clock signal, when the discrimination is that the voltage level of the clock signal exceeds reference voltage by using the discriminating means, the first pulse is generated by outputting prescribed logical level, while when the discrimination is that the voltage level of the clock signal does not exceed reference voltage by using the discriminating means, the second pulse is generated by outputting prescribed logical level. According to this operation, it is capable of being implemented conversion between logical level of the clock signal having prescribed duty ratio and logical level of the first and the second pulse signals.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIGS. 2A to 2G are signal waveform views showing situation of respective signals in the clock signal generator shown in FIG. 1;

FIGS. 4A to 4F are signal waveform views showing situation of change of respective signals of the system shown in FIG. 3;

DETAILED DESCRIPTION OF THE PREFERRED EMBODIMENTS

A preferred embodiment of the present invention will now be described in accordance with the accompanying drawings.

Figure 3:
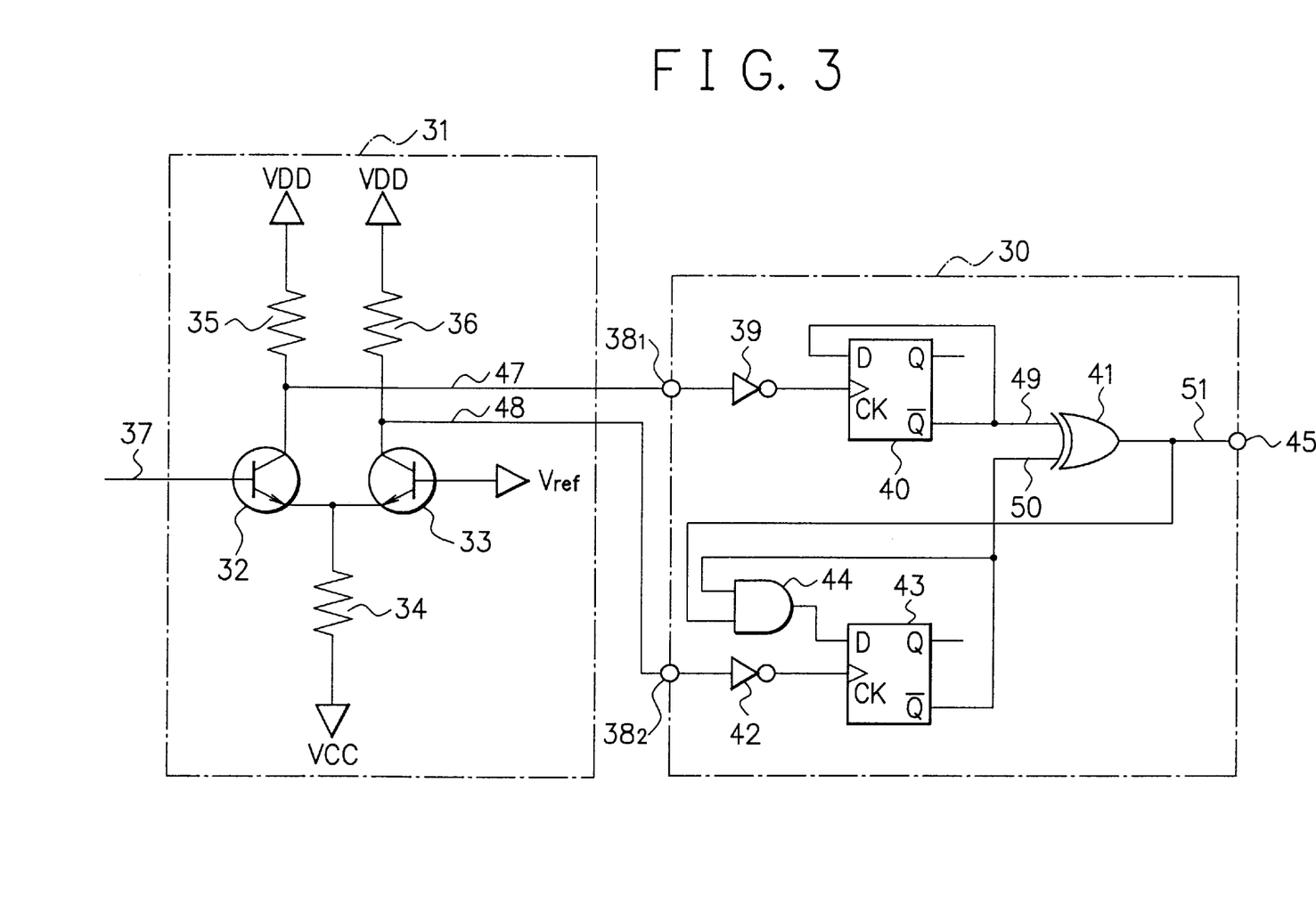
FIG. 3 is a constitution view showing an outline of the constitution in which a clock signal generator in one embodiment of the present invention is applied to the system into which the clock signal is inputted through a level comparator.

FIG. 3 shows an outline of a constitution of a clock signal generator in one embodiment of the present invention. A clock signal having prescribed duty ratio is inputted to the clock signal generator 30 through a level comparator from an external side. An output signal whose both edges are sharp, and which has the same duty ratio as that of the original signal is generated while using only sharp edge between a leading edge and a trailing edge of the clock signal. In the present embodiment, there will be described a case where a clock signal with constant duty ratio is generated using only a trailing edge in spite of dull leading edge.

A level comparator 31 implements conversion in high speed between logical level of transmission system in which an original clock signal generated by an external clock signal generator not illustrated is transmitted thereto and an logical level on the inside of the clock signal generator 30. The level comparator 31 is provided with a first transistor 32 and a second transistor 33. The first and the second transistors 32, and 33 have approximately the same characteristic in that the first and the second transistors have the same temperature coefficient and so forth. Respective emitter terminals of the first and the second transistors 32, and 33 are connected with each other, thus being connected to Vcc to be ground electric potential of a power source not illustrated through a resistor 34. Further, a collector terminal of the first transistor 32 is connected to $V_{DD}$ to be power source electric potential level of a power source not illustrated through a resistor 35, and a collector terminal of the second transistor 33 is connected to $V_{DD}$ to be power source electric potential of power source not illustrated through a resistor 36. Furthermore, the original clock signal 37 having prescribed duty ratio is inputted to a base terminal of the first transistor 32. The collector terminal of the first transistor 32 is further connected to an input terminal $38_1$ of the clock signal generator 30. A collector terminal of the second transistor 33 is connected to an input terminal $38_2$ of the clock signal generator 30, thus an output signal undergoing logical conversion is inputted to the clock signal generator 30.

In the clock signal generator 30, the input terminal $38_1$ is connected to the first INV circuit (Inverter circuit) 39. An inversion signal of a signal inputted through the input terminal 38, is connected to a clock input terminal (CK) of the first D-FF 40. An inversion output terminal (Q(–)) of the first D-FF 40 is connected to one side of input terminal of 2-input Exclusive OR (hereinafter referring to EXOR) circuit 41, and also connected to a data input terminal (D) of the first D-FF 40. Further, the input terminal $38_2$ is connected to the second INV circuit 42. And an inversion signal of the signal inputted through the input terminal $38_2$ is connected to the clock input terminal (CK) of the second D-FF 43. The inversion output terminal (Q(–)) of the D-FF 40 is connected to another input terminal of the EXOR circuit 41, and also connected to one side of input terminal of the 2-input AND circuit 44. The another input terminal of the 2-input AND circuit 44 is connected to an output terminal of the EXOR circuit 41. An output terminal of the 2-input AND circuit 44 is connected to the data input terminal (D) of the second D-FF 43. An output terminal of the EXOR circuit 41 is connected to the output terminal 45 of the clock signal generator 30 to output a clock signal for maintaining the duty ratio in spite of changing speed of the leading edge of the inputted clock signal through the output terminal 45 toward the external section.

In the clock signal generator 30, the original clock signal 37 having prescribed duty ratio is inputted from external section, before, the electric potential level is compared with a reference voltage Vref. When the original clock signal 37 whose electric potential level is higher than the reference voltage Vref is inputted, the first transistor 32 becomes ON state, thus prescribed ON current flows from the power source electric potential level $V_{DD}$ via the resistor 35, the collector terminal of the first transistor 32, and the emitter terminal of the first transistor 32, to the resistor 34. According to this operation, level of electric potential of the emitter terminal of the first transistor 32 increase because of the ON current flowing through the resistor 34. And then, the reference voltage Vref added to the base terminal of the second transistor 33 and an electric potential level of the emitter terminal become small, thus the second transistor 33 becomes OFF state gradually. Consequently, a signal is supplied to the input terminal $38_2$ connected to the collector terminal of the second transistor 33, which signal causes an electric potential level to be increased gradually from approximately ground electric potential level Vcc through the resistor 34 caused by the fact that the second transistor 33 becomes ON state, to an electric potential level in the neighborhood of the power source electric potential level $V_{DD}$.

On the other hand, when the original clock signal 37 whose electric potential level is lower than the reference voltage Vref is inputted, since both characteristics of the first and the second transistors 32, and 33 are approximately equal, the second transistor 33 which the reference voltage Vref with high electric potential is provided for the base terminal becomes ON state. And then, similar to the above-described manner, potential difference between the base terminal of the first transistor 32 and the emitter terminal is decreased, thus the first transistor 32 becomes OFF state. Consequently, the signal supplied to the input terminal $38_2$ decrease into the ground electric potential level Vcc in conformity with the ON state of the second transistor 33. The first transistor 32 becomes OFF state gradually in answer to ON current of the second transistor 33. Consequently, a signal is supplied to the input terminal $38_1$ connected to the collector terminal of the first transistor 32, which signal causes an electric potential level to be increased gradually from approximately ground electric potential level Vcc through the resistor 34 caused by the fact that the first transistor 32 becomes ON state, to an electric potential level in the neighborhood of the power source electric potential level $V_{DD}$.

Namely, such the level comparator 31 outputs open collector output. Due to the open collector output, there is provided the signal whose leading edge is dull and whose trailing edge is sharp, and which signal has opposite phases with each other for the clock signal generator 30 while being synchronized with the original clock signal 37 inputted. The signal inputted to the input terminal $38_1$ is a signal whose trailing edge is sharp while being synchronized with the leading edge of the original clock signal 37. The signal inputted to the input terminal $38_2$ is a signal whose trailing edge is sharp while being synchronized with the trailing edge of the original clock signal 37.

In the clock signal generator 30 of the present embodiment, since the signal inputted from the input terminal $38_1$ is inputted to a clock input terminal (CK) of the first D-FF 40 having function of T-FF through the first INV circuit 39, the clock signal generator 30 outputs frequency division signal synchronized with the trailing edge of an input signal from the input terminal $38_1$ to the EXOR circuit 41. Similarly, since the signal inputted from the input terminal $38_2$ is inputted to the clock input terminal (CK) of the second D-FF 43 having function of T-FF through the second INV circuit 42, the clock signal generator 30 outputs the frequency division signal synchronized with the trailing edge of the input signal from the input terminal $38_2$ for the EXOR circuit 41.

On this occasion, the inversion output terminal (Q(–)) of the second D-FF 43 is also connected to the 2-input AND circuit 44. The second D-FF 43 causes the data input terminal (D) of the second D-FF 43 to be inputted "L" level forcibly when the EXOR circuit 41 is "L" level at the time of trailing of the signal inputted from the input terminal $38_2$. Namely, in cases where a phase of an output signal of the EXOR circuit 41 disagrees with a phase of the signal inputted from the input terminal $38_2$ to be in-phase to the original clock signal 37 therebetween, because both of the first D-FF 40 and an initial state of the second D-FF 43 do not become always certain prescribed value, The clock signal generator causes the D-terminal of the D-FF 24 to be established "L" level forcibly, thus permitting the phases of both signals to agree therewith each other.

Figure 4A:
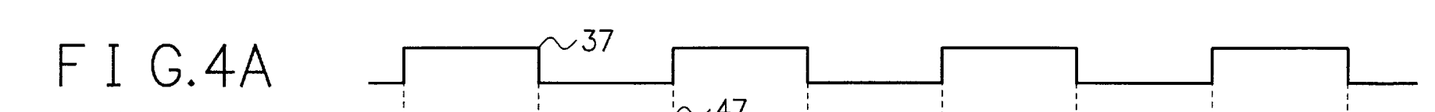
FIG. 4A is a signal waveform view showing a signal waveform of an original clock signal.
Figures 4B, 4C, 4D:
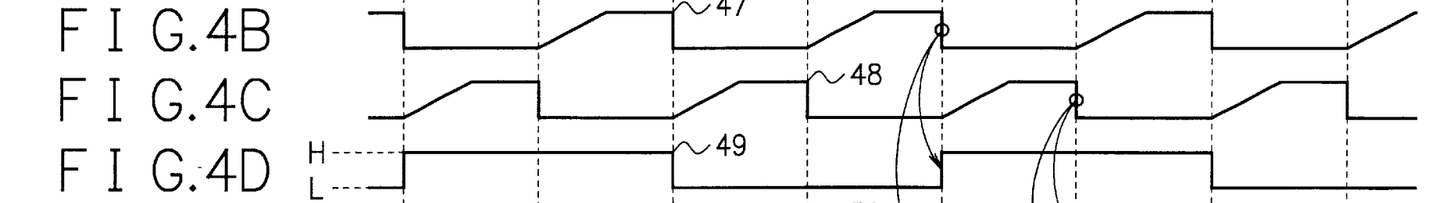
FIG. 4B is a signal waveform view showing a signal waveform of a first clock signal.
FIG. 4C is a signal waveform view showing a signal waveform of a second clock signal.
FIG. 4D is a signal waveform view showing a signal waveform of a first inversion output signal.
Figure 4E:
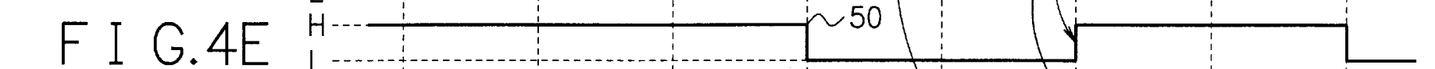
FIG. 4E is a signal waveform view showing a signal waveform of a second inversion output signal.
Figure 4F:
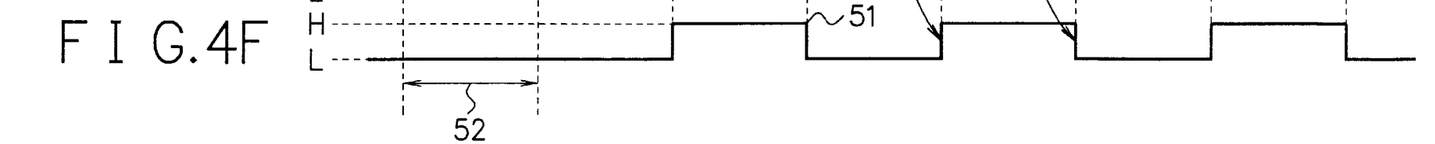
FIG. 4F is a signal waveform view showing a signal waveform of an output clock signal 51.

FIGS. 4A to 4F indicate appearance of change of signal level in respective points of the clock signal generator 30 and the level comparator 30 in FIG. 3. Namely, FIG. 4A indicates signal waveform of the original clock signal 37 inputted in FIG. 3. FIG. 4B indicates signal waveform of the first clock signal 47 inputted from the input terminal $38_1$ in FIG. 3. FIG. 4C indicates signal waveform of the second clock signal 48 inputted from the inputted terminal $38_2$ in FIG. 3. FIG. 4D indicates signal waveform of the first inversion output signal 49 outputted from the inversion output terminal (Q(–)) of the first D-FF 40. FIG. 4E indicates signal waveform of the second inversion output signal 50 outputted from the inversion output terminal (Q(–)) of the second D-FF 43. FIG. 4F indicates signal waveform of the output clock signal 51 outputted from the output terminal 45 in FIG. 3.

Here, on the supposition that a clock signal 37 having prescribed duty ratio is inputted from an external section as shown in FIG. 4A. As mentioned above, the level comparator 31 compares the original clock signal 37 with the reference voltage Vref And then, when voltage level of the original clock signal 37 is higher than the reference voltage Vref, the first transistor 32 becomes ON state, before the first clock signal 47 becomes ground voltage level Vcc as shown in FIG. 4B. Further, simultaneously, the second clock signal 48 provided to the input terminal $38_2$ approaches to the power source voltage level $V_{DD}$ gradually, because the second transistor 33 becomes OFF state gradually as shown in FIG. 4C. On the other hand, when the voltage level of the original clock signal 37 is lower than the reference voltage level Vref, the second transistor 33 becomes ON state, before the second clock signal 48 becomes ground voltage level Vcc, as shown in FIG. 4C. Furthermore, simultaneously, the first clock signal 47 which is provided for the input terminal $38_1$ approaches to the power source voltage level $V_{DD}$ gradually, because the first transistor 32 becomes OFF state gradually as shown in FIG. 4B. The first D-FF 40 causes the output to be inverted in every input while being synchronized with the trailing edge of the first clock signal 47, because the first D-FF 40 functions as the T-FF as shown in FIG. 4D. Moreover, the second D-FF 43 also causes the output to be inverted in every input while being synchronized with the trailing edge of the second clock signal 48, because the second D-FF 43 functions as the T-FF as shown in FIG. 4E.

In the period 52, the clock signal generator 30 causes the "L" level to be established to the data input terminal (D) of the second D-FF 43 in the 2-input AND circuit 44 forcibly, because the phase of the output signal 51 to be the output of the EXOR circuit 41 disagrees with the phase of the second clock signal 48 inputted from the input terminal $38_2$ which the second clock signal 48 becomes in-phase to the original clock signal 37. This establishment allows the "L" level to be performed sampling at the trailing of the second clock signal 48 inputted to the clock input terminal (CK) of the second D-FF 43, thus hereafter permitting the both phases to agree with each other.

As mentioned above, in the clock signal generator according to the present invention, when the clock signal generator converts logical level of the original clock signal 37, a first and a second clock signals 47, and 48 which are outputted through open collector corresponding to respective "H" level and "L" level of the original clock signal are inputted thereto. Respective leading edges of the first and the second clock signals 47, and 48 are dull waveform. Respective trailing edges of the first and the second clock signals 47, and 48 are sharp waveform. Therefore, only the trailing edge whose speed of change is sharp is used. The first and the second clock signals 47, and 48 are performed ½-times frequency division respectively to obtain exclusive OR of the both clock signals. Thus an output clock signal 51 which has the same duty ratio as that of the original clock signal 37 is generated. Further, a phase of an output signal of the EXOR circuit 41 disagrees with a phase of an inputted signal from the input terminal $38_2$ which inputted signal becomes in-phase to the original clock signal, from the reason why the initial state of the first D-FF 40 and the initial state of the second D-FF 43 always do not become certain prescribed value. In such the case, the clock signal generator causes the "L" level to be established forcibly to the data input terminal (D) of the second D-FF 43, thus hereafter permitting the phase of the both signals to agree with each other. According to this operation, it is capable of being generated a clock signal which has the same duty ratio as unchanged original duty ratio of the original clock signal 37, and whose both edges are sharp, which has a logical level converted by the level comparator 31, and which is not influenced from variation of power source voltage of the device or an effect of manufacturing dispersion. As a result, a device in which this clock signal is used is easy to be designed.

Further, in the present embodiment, the output of the second D-FF 43 is rectified by "AND" between the second inverse output signal 50 and the output clock signal 51. However, the rectification is not restricted by this method. For instance, the output of the first D-FF 40 is capable of being rectified appropriately according to the output clock signal 51 and the first inversion output signal 49.

Furthermore, in the present embodiment, only the trailing edge is used for generating a clock signal from output signal of the level comparator 31 of the open collector output, however when leading edge of inputted clock signal is sharp and trailing edge of inputted signal is dull, it is capable of being generated similarly an output clock signal with the same duty ratio as that of the input clock signal while using only the leading edge. For instance, respective the first and the second INV circuits 39, and 42 are removed from the clock signal generator 30, with the result that there can be obtained exclusive OR between frequency division signal of a signal which is synchronized with the leading edge of the first clock signal 47 and frequency division signal of a signal which is synchronized with the leading edge of the second clock signal 48, thus, it is capable of being generated an output clock signal which is provided with a leading edge synchronized with the leading edge of the second clock signal 48 and a trailing edge synchronized with the leading edge of the first clock signal 47. Also in this case, it is capable of being rectified a phase by establishing duty ratio to a prescribed value according to the output clock signal 51, and the first or the second inversion output signal.

As described above, according to the present invention, even though the leading edge of the first and the second pulse signals obtained from the clock signal is dull, it is capable of being generated an output clock signal which has the unchanged original duty ratio of the clock signal and whose both edges are sharp. Further, such the clock signal does not undergo change of power source voltage of the device and/or influence of the manufacturing dispersion, thereby, a device using this clock signal is easy to be designed.

Further, according to the present invention, even though the leading edge of the clock signal itself is dull, since only the trailing edge of the first and the second pulse signal obtained from this clock signal is used, it is capable of being generated an output clock signal which has the unchanged original duty ratio of the clock signal and whose both edges are sharp. Further, such the clock signal does not undergo change of power source voltage of the device and/or influence of the manufacturing dispersion, thereby, a device using this clock signal is easy to be designed.

Furthermore, according to the present invention, even though the trailing edges of both of the first and the second pulse signal obtained from the clock signal are dull, or even though the trailing edge of the clock signal itself is dull, since only the trailing edge of the first and the second pulse signals obtained from this clock signal is used, it is capable of being generated an output clock signal which has the unchanged original duty ratio of the clock signal and whose both edges are sharp.

Moreover, according to the present invention, it is capable of being generated an output clock signal with in-phase to the original clock signal, from the original clock signal with prescribed duty ratio, which output clock signal has the same duty ratio as that of the original clock signal and whose both edges are sharp.

Still moreover, according to the present invention, an output clock signal which has the same duty ratio as that of inputted clock signal and whose both edges are sharp is capable of being generated from the clock signal in which a logical level is converted between the clock signal having prescribed duty ratio and the first and the second pulse signal.

While preferred embodiments of the invention have been described using specific terms, the description has been for illustrative purpose only, and it is to be understood that changes and variations may be made without departing from the spirit or scope of the following claims.

What is claimed is:

1. A clock signal generator comprising:
   a first frequency dividing means for implementing ½-times frequency division to a first pulse signal which changes corresponding to high level period of a clock signal having prescribed duty ratio while being synchronized with a trailing edge of said first pulse signal;
   a second frequency dividing means for implementing ½-times frequency division to a second pulse signal which changes corresponding to low level period of said clock signal while being synchronized with a trailing edge of said second pulse signal; and
   an exclusive OR circuit for supplying a first frequency division signal generated by said first frequency dividing means to one side of an input terminal and for supplying a second frequency division signal generated by said second frequency dividing means to an another side of an input terminal, thus outputting an output clock signal from an output terminal thereof.

2. A clock signal generator as claimed in claim 1, wherein said pulse signal generating means comprises:
   a discriminating means for discriminating whether voltage level of said clock signal exceeds predetermined reference voltage;
   a first pulse generating means for generating said first pulse by outputting prescribed logical level when it is discriminated that said voltage level of said clock signal exceeds said reference voltage, by means of said discriminating means; and
   a second pulse generating means for generating said second pulse by outputting said prescribed logical level when it is discriminated that said voltage level of said clock signal does not exceed said reference level, by means of said discriminating means.

3. A clock signal generator as claimed in claim 1, wherein said first frequency dividing means implements ½-times frequency division to said first pulse signal while being synchronized with a leading edge of said first pulse signal and said second frequency dividing means implements ½-times frequency division to said second pulse signal while being synchronized with a leading edge of said second pulse signal.

4. A clock signal generator as claimed in claim 3, wherein any of either said first frequency dividing means or said second frequency dividing means changes phase of said output clock signal according to said output clock signal, and either said first pulse signal or said second pulse signal.

5. A clock signal generator as claimed in claim 1, wherein any of either said first frequency dividing means or said second frequency dividing means changes phase of said output clock signal according to said output clock signal, and either said first pulse signal or said second pulse signal.

6. A clock signal generator as claimed in claim 5, wherein said pulse signal generating means comprises:
   a discriminating means for discriminating whether voltage level of said clock signal exceeds predetermined reference voltage;
   a first pulse generating means for generating said first pulse by outputting prescribed logical level when it is discriminated that said voltage level of said clock signal exceeds said reference voltage, by means of said discriminating means; and
   a second pulse generating means for generating said second pulse by outputting said prescribed logical level when it is discriminated that said voltage level of said clock signal does not exceed said reference level, by means of said discriminating means.

7. A clock signal generator as claimed in claim 4, wherein said pulse signal generating means comprises:
   a discriminating means for discriminating whether voltage level of said clock signal exceeds predetermined reference voltage;
   a first pulse generating means for generating said first pulse by outputting prescribed logical level when it is discriminated that said voltage level of said clock signal exceeds said reference voltage, by means of said discriminating means; and
   a second pulse generating means for generating said second pulse by outputting said prescribed logical level when it is discriminated that said voltage level of said clock signal does not exceed said reference level, by means of said discriminating means.

8. A clock signal generator comprising:
   a pulse signal generating means for generating a first pulse signal which is in-phase to high level period of a clock signal having prescribed duty ratio and a second pulse signal which is in-phase to low level period of said clock signal;
   a first frequency dividing means for implementing ½-times frequency division to a first pulse signal generated by said pulse signal generating means while being synchronized with a trailing edge of said first pulse signal;
   a second frequency dividing means for implementing ½-times frequency division to a second pulse signal generated by said pulse signal generating means while being synchronized with a trailing edge of said second pulse signal; and
   an exclusive OR circuit for supplying a first frequency division signal generated by said first frequency dividing means to one side of input terminal thereof and for supplying a second frequency division signal generated by said second frequency dividing means to another side of input terminal thereof, and for outputting an output clock signal from an output terminal of said exclusive OR circuit.

9. A clock signal generator as claimed in claim 8, wherein said first frequency dividing means implements ½-times frequency division to said first pulse signal while being synchronized with a leading edge of said first pulse signal and said second frequency dividing means implements ½-times frequency division to said second pulse signal while being synchronized with a leading edge of said second pulse signal.

10. A clock signal generator as claimed in claim 8, wherein said pulse signal generating means comprises:
   a discriminating means for discriminating whether voltage level of said clock signal exceeds predetermined reference voltage;

a first pulse generating means for generating said first pulse by outputting prescribed logical level when it is discriminated that said voltage level of said clock signal exceeds said reference voltage, by means of said discriminating means; and a second pulse generating means for generating said second pulse by outputting said prescribed logical level when it is discriminated that said voltage level of said clock signal does not exceed said reference level, by means of said discriminating means.

11. A clock signal generator as claimed in claim 8, wherein said pulse signal generating means comprises:

a discriminating means for discriminating whether voltage level of said clock signal exceeds predetermined reference voltage;

a first pulse generating means for generating said first pulse by outputting prescribed logical level when it is discriminated that said voltage level of said clock signal exceeds said reference voltage, by means of said discriminating means; and a second pulse generating means for generating said second pulse by outputting said prescribed logical level when it is discriminated that said voltage level of said clock signal does not exceed said reference level, by means of said discriminating means.

12. A clock signal generator as claimed in claim 9, wherein any of either said first frequency dividing means or said second frequency dividing means changes phase of said output clock signal according to said output clock signal, and either said first pulse signal or said second pulse signal.

13. A clock signal generator as claimed in claim 8, wherein any of either said first frequency dividing means or said second frequency dividing means changes phase of said output clock signal according to said output clock signal, and either said first pulse signal or said second pulse signal.

14. A clock signal generator as claimed in claim 13, wherein said pulse signal generating means comprises:

a discriminating means for discriminating whether voltage level of said clock signal exceeds predetermined reference voltage;

a first pulse generating means for generating said first pulse by outputting prescribed logical level when it is discriminated that said voltage level of said clock signal exceeds said reference voltage, by means of said discriminating means; and a second pulse generating means for generating said second pulse by outputting said prescribed logical level when it is discriminated that said voltage level of said clock signal does not exceed said reference level, by means of said discriminating means.

15. A clock signal generator as claimed in claim 9, wherein said pulse signal generating means comprises:

a discriminating means for discriminating whether voltage level of said clock signal exceeds predetermined reference voltage;

a first pulse generating means for generating said first pulse by outputting prescribed logical level when it is discriminated that said voltage level of said clock signal exceeds said reference voltage, by means of said discriminating means; and a second pulse generating means for generating said second pulse by outputting said prescribed logical level when it is discriminated that said voltage level of said clock signal does not exceed said reference level, by means of said discriminating means.

16. A clock signal generator as claimed in claim 12, wherein said pulse signal generating means comprises:

a discriminating means for discriminating whether voltage level of said clock signal exceeds predetermined reference voltage;

a first pulse generating means for generating said first pulse by outputting prescribed logical level when it is discriminated that said voltage level of said clock signal exceeds said reference voltage, by means of said discriminating means; and a second pulse generating means for generating said second pulse by outputting said prescribed logical level when it is discriminated that said voltage level of said clock signal does not exceed said reference level, by means of said discriminating means.

\* \* \* \* \*